United States Patent [19]
Knowles et al.

[11] Patent Number: 6,025,592
[45] Date of Patent: *Feb. 15, 2000

[54] HIGH TEMPERATURE SPECIMEN STAGE AND DETECTOR FOR AN ENVIRONMENTAL SCANNING ELECTRON MICROSCOPE

[75] Inventors: W. Ralph Knowles, North Andover; Thomas A. Hardt, Tewksbury, both of Mass.

[73] Assignee: Philips Electronics North America, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/695,207

[22] Filed: Aug. 7, 1996

Related U.S. Application Data

[60] Provisional application No. 60/002,213, Aug. 11, 1995.
[51] Int. Cl.[7] .................................................. H01T 37/26
[52] U.S. Cl. ................ 250/310; 250/442.11; 250/443.11
[58] Field of Search ............................. 250/310, 443.11, 250/442.11, 440.11

[56] References Cited

U.S. PATENT DOCUMENTS

| | | | |
|---|---|---|---|
| 3,896,314 | 7/1975 | Nukui et al. | 250/443.1 |
| 3,919,558 | 11/1975 | Brouillette et al. | 250/443.11 |
| 4,789,781 | 12/1988 | Kitagawa et al. | 250/310 |
| 4,823,006 | 4/1989 | Danilatos et al. | 250/310 |
| 4,992,662 | 2/1991 | Danilatos | 250/310 |
| 5,097,134 | 3/1992 | Kimoto et al. | 250/443.1 |
| 5,362,964 | 11/1994 | Knowles et al. | 250/310 |
| 5,396,067 | 3/1995 | Suzuki et al. | 250/310 |
| 5,412,211 | 5/1995 | Knowles et al. | 250/310 |
| 5,466,936 | 11/1995 | Kohama et al. | 250/310 |

FOREIGN PATENT DOCUMENTS

WO 97/07525  2/1997  WIPO .

OTHER PUBLICATIONS

Fulrath, "Scanning Electron Microscopy to 1600°C", Scanning Electron Microscopy/1972 (Part I), Proc. of the Fifth Annual Scanning Electron Microscope Symposium, IIT Research Institute, Chicago, Ill., pp. 17–24 (Apr. 1972).

*Primary Examiner*—Kiet T. Nguyen
*Attorney, Agent, or Firm*—Frommer Lawrence & Haug LLP

[57] ABSTRACT

An environmental scanning electron microscope is provided which is capable of maintaining a specimen at a temperature up to approximately 1500° C. In this environmental scanning electron microscope, a specimen chamber maintains the specimen enveloped in gas in registration with a final pressure limiting aperture of the objective lens assembly. The specimen chamber includes a specimen stage having a sample platform for supporting the specimen under examination at a first vertical height and a specimen heating assembly which includes a non-inductively wound heater coil which is positioned closely adjacent to the sample platform and extends to a second vertical height which is significantly above the first vertical height so that the top of the specimen is maintained at a high temperature. In this environmental scanning electron microscope, a heat shield assembly is positioned above the specimen heating assembly in the specimen chamber to avoid radiant heat loss and which has an adjustable bias voltage applied thereto to accelerate secondary electrons through its central opening to be collected by an electron detector. Moreover, in order to enhance image quality, the final pressure limiting aperture and the electron detector are biased at different voltages with the bias applied to the final pressure limiting aperture floated to provide for automatic compensation. A specimen stage moving assembly is also provided to move the specimen stage with respect to the heat shield assembly to enhance the field-of-view of the specimen.

82 Claims, 8 Drawing Sheets

HIGH TEMPERATURE SPECIMEN STAGE AND DETECTOR FOR AN ENVIRONMENTAL SCANNING ELECTRON MICROSCOPE

CROSS-REFERENCE TO RELATED APPLICATIONS

This application is based upon U.S. Provisional Patent Application Ser. No. 60/002,213, filed Aug. 11, 1995, the subject matter of which is incorporated by reference.

FIELD OF THE INVENTION

This invention relates to the field of environmental scanning electron microscopes ("ESEM"), and more particularly, to a hot temperature stage for an environmental scanning electron microscope which is capable of heating a specimen up to a temperature of approximately 1500° C., and a detector which allows imaging of the specimen at high temperatures.

BACKGROUND OF THE INVENTION

As background, the advantages of a environmental scanning electron microscope over the standard scanning electron microscope ("SEM") lie in its ability to produce high-resolution electron images of moist or nonconductive specimens (e.g., biological materials, plastics, ceramics, fibers) which are extremely difficult to image in the usual vacuum environment of the SEM. The environmental scanning electron microscope allows the specimen to be maintained in its "natural" state, without subjecting it to the distortions caused by drying, freezing, or vacuum coating normally required for high-vacuum electron beam observation. Also, the relatively high gas pressure easily tolerated in the ESEM specimen chamber acts effectively to dissipate the surface charge that would normally build up on a nonconductive specimen, blocking high quality image acquisition. The ESEM also permits direct, real-time observation of liquid transport, chemical reaction, solution, hydration, crystallization, and other processes occurring at relatively high vapor pressures, far above those that can be permitted in the normal SEM specimen chamber.

Typically, in an ESEM, the electron beam is emitted by an electron gun and passes through an electron optical column of an objective lens assembly having a final pressure limiting aperture at its lower end thereof. In the electron optical column, the electron beam passes through magnetic lenses which are used to focus the beam and direct the electron beam through the final pressure limiting aperture.

The beam is subsequently directed into a specimen chamber through the final pressure limiting aperture wherein it impinges upon a specimen supported upon a specimen stage. The specimen stage is positioned for supporting the specimen approximately 1 to 10 mm below the final pressure limiting aperture so as to allow the beam of electrons to interact with the specimen. The specimen chamber is disposed below the optical vacuum column and is capable of maintaining the sample enveloped in gas, preferably nitrogen or water vapor, at a pressure of approximately between $10^{-2}$ and 50 Torr in registration with the final pressure limiting aperture such that a surface of the specimen may be exposed to the charged particle beam emitted from the electron gun and directed through the final pressure limiting aperture.

Figure 1:
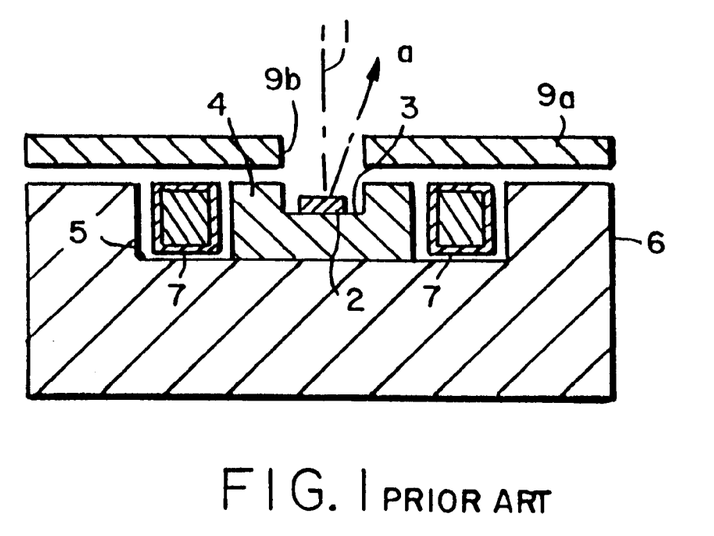
FIG. 1 is schematic representation of a conventional specimen stage used in conjunction with an environmental scanning electron microscope.
Figure 2:
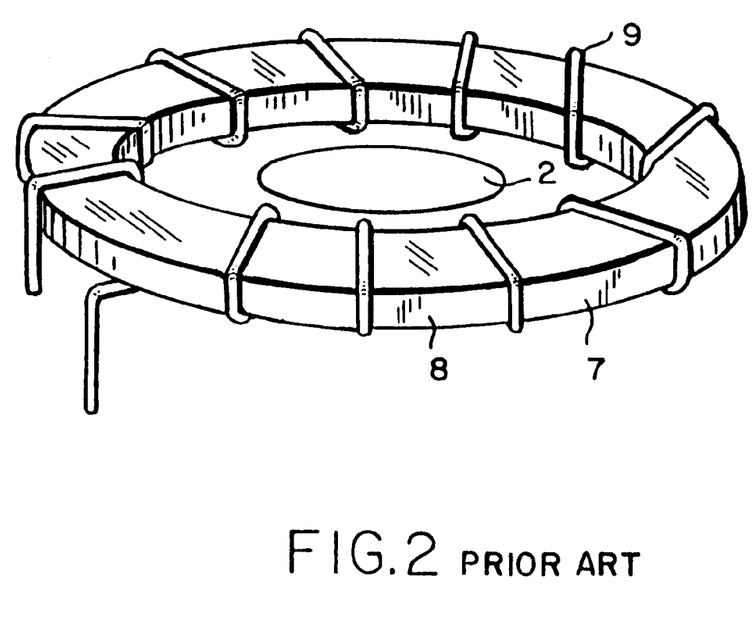
FIG. 2 is a schematic representation of a conventional heating assembly used with the specimen stage of FIG. 1.

The typical specimen stage previously used in an environmental scanning electron microscope to image samples at high temperatures is illustrated in FIG. 1. In that prior specimen stage, the electron beam 1 strikes a surface of the specimen 2 which is supported in a recess 3 of a sample cup 4 which is supported in a depression 5 of an insulating jacket 6. An annular heating assembly 7 is provided in the depression 5 between the insulating jacket 6 and the sample cup 4, which is best shown in FIG. 2. This heater assembly 7 is formed of an annular toroidal ceramic former 8 having a heater wire 9 wound therearound such that the heater wire 9 is provided remote from the sample 2 and does not extend above the sample. In the prior specimen stage of FIG. 1, a heat shield 9a is positioned on top of the sample cup 4, the insulated jacket 6, and the heater assembly 7 which has a central opening 9b such that the electron beam can pass therethrough and strike the specimen 2.

For the reasons set forth above and below, the prior specimen stage for an environmental scanning electron microscope shown in FIGS. 1 and 2 has disadvantageously been unable to achieve sample temperatures of at least 1500° C. First, the heater wire 9 cannot be made of tungsten because it will oxidize in the water vapor of the environmental scanning electron microscope. Hence, platinum wire must be used, but platinum melts at 1700° C. Second, the heater is provided too remote from the sample and is significantly hotter than the sample. Finally, heat is radiated and convected from the surface of the sample as is represented by arrow a in FIG. 1 so that the bottom of the sample is hotter than the top, but the user is observing the top of the sample and the top surface cannot then be maintained at temperatures of at least 1500° C. due to this radiant heat loss. Hence, utilizing the toroidal heater of FIGS. 1 and 2 in an environmental scanning electron microscope failed to achieve a sample temperature of 1500° C.

Objects of the Invention

Therefore, it is an object of the present invention to provide a hot temperature specimen stage for an environmental scanning electron microscope which avoids the aforementioned deficiencies of the prior art.

It is also an object of this invention to provide a hot temperature specimen stage for an environmental scanning electron microscope which achieves a sample temperature of at least approximately 1500° C.

It is a further object of this invention to provide a hot temperature specimen stage for an environmental scanning electron microscope wherein the sample cup is made of a high thermally conductive material to thereby minimize the temperature differential between the top and bottom of the sample cup.

It is another object of this invention to provide a high temperature specimen stage for an environmental scanning electron microscope wherein the heater is wound as a coil so that the entirety of the wire is positioned close to the sample cup.

It is yet another object of this invention to provide a high temperature specimen stage for an environmental scanning electron microscope wherein the heater assembly extends well above the sample so as to reduce the heat lost from the sample surface.

It is still a further object of this invention to provide a high temperature stage for an environmental scanning electron microscope wherein the heater is in the form of a wound coil to minimize the magnetic field from the heating current which otherwise would cause deflection of the primary electron beam.

Various other objects, advantages and features of the present invention will become readily apparent from the ensuing detailed description and the novel features will be particularly pointed out in the appended claims.

SUMMARY OF THE INVENTION

This invention relates to a hot temperature specimen stage for an environmental scanning electron microscope which is capable of achieving a sample temperature of up to at least approximately 1500° C. In the environmental scanning electron microscope in which this hot temperature specimen stage is employed, an electron beam is generated by an electron gun which passes through an electron optical column until the electron beam is focused and scanned across the diameter of a final pressure limiting aperture provided at the lower end of the electron optical column. The final pressure limiting aperture separates the relatively high vacuum of the electron optical column from the relatively low vacuum of the specimen chamber.

The specimen chamber is positioned below the electron optical column and is capable of maintaining the specimen enveloped in gas in registration with the final pressure limiting aperture such that a surface of the specimen may be exposed to the focused beam of electrons. A specimen stage is located within the specimen chamber and is positioned for supporting the specimen approximately 1 to 25 mm below the final pressure limiting aperture so as to allow the focused beam of electrons to interact with the specimen. In the specimen chamber, the specimen is maintained at a pressure between about $10^{-2}$ and 50 Torr, and preferably approximately 10 Torr.

In the high temperature specimen stage of the environmental scanning electron microscope of this invention, a sample platform is provided for supporting the specimen. The sample platform is in the form of a loose, disposable, sample cup made of a high thermally conductive material which is contained within a recess of an insulating jacket. The specimen is supported in a depression of the sample cup at a first vertical height.

In this specimen stage, a specimen heater assembly heats the specimen and includes a non-inductively wound heater wire coil which is positioned closely adjacent to the sample cup and extends to a second vertical height of the specimen which is significantly above the first vertical height of the specimen so that the top surface of the specimen is maintained at a high temperature.

In order to further avoid radiant heat loss, a heat shield assembly is provided in the specimen chamber above the specimen heating assembly. This heat shield assembly includes a central opening to permit the electron beam to pass therethrough and strike the sample. In addition, the heat shield assembly includes a plurality of thin ceramic insulating shields which act as heat reflectors and a plurality of perforated metal support plates integrally found therewith to avoid warping of the heat shield assembly at high temperatures.

Further, the heat shield assembly is mounted separately from the specimen heater assembly which allows for a larger field of view.

Accordingly, the design of this hot temperature specimen stage for an environmental scanning electron microscope achieves the following advantages over the previous specimen stage of FIG. 1:

1. the sample cup is made of high thermally conductive material to minimize the temperature differential between the top and bottom of the sample cup;

2. the heater assembly is formed as a non-inductively wound heater coil to minimize the magnetic field from the heating element which would otherwise cause a deflection of the primary electron beam which thereby allows the heater wire to be positioned close to the sample cup; and 3. the heater coil extends significantly above the sample so that the heat lost from the top of sample is reduced.

Further, an adjustable bias voltage of up to approximately 500V can be applied to the heat shield assembly to accelerate secondary electrons emanating from the surface of the specimen to pass through the central opening of the heat shield assembly to be collected by an electron detector assembly. In one embodiment, the electron detector assembly can be in the form of a thin ring electrode, and in order to enhance image quality, the final pressure limiting aperture can be biased at a different voltage than the bias applied to the thin ring electrode. In addition, the bias voltage applied to the final pressure limiting aperture can float to provide for automatic compensation. In order to suppress thermal electrons, a bias voltage of between approximately +50 and −50V can be applied to the sample cup.

In this environmental scanning electron microscope, the heat shield assembly is aligned with respect to the final pressure limiting aperture and the electron detector and is separated from the specimen stage. Thus, the present invention provides a specimen stage moving assembly for laterally moving the specimen stage independently of the heat shield assembly to enhance the field-of-view of the specimen.

BRIEF DESCRIPTION OF THE DRAWINGS

The following detailed description given by way of example, but not intended to limit the invention solely to the specific embodiments described, may best be understood in conjunction with the accompanying drawings in which.

DETAILED DESCRIPTION OF CERTAIN PREFERRED EMBODIMENTS

Figure 3:
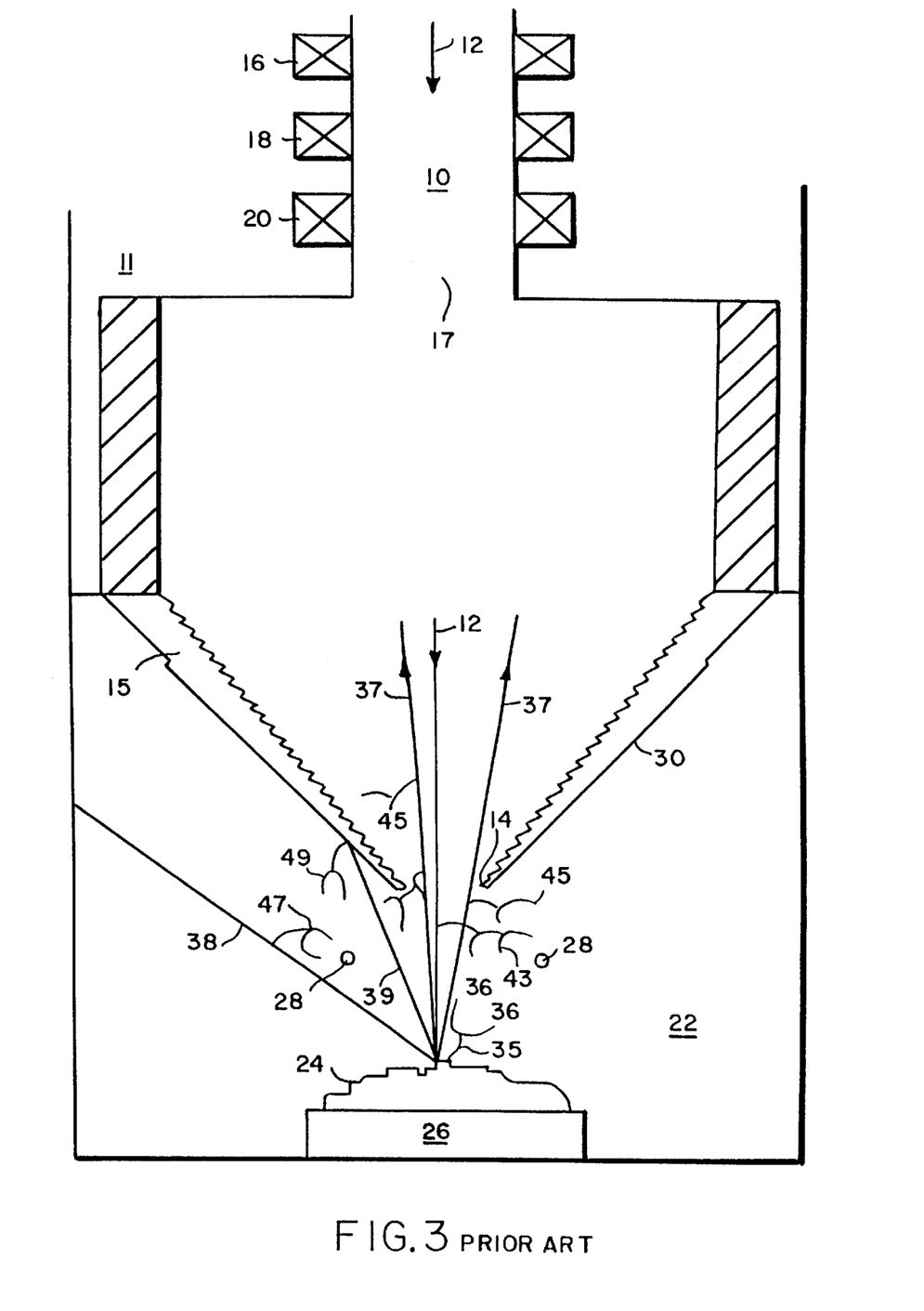
FIG. 3 is a schematic representation of an example of electron trajectory paths in an environmental scanning electron microscope.
Figure 4:
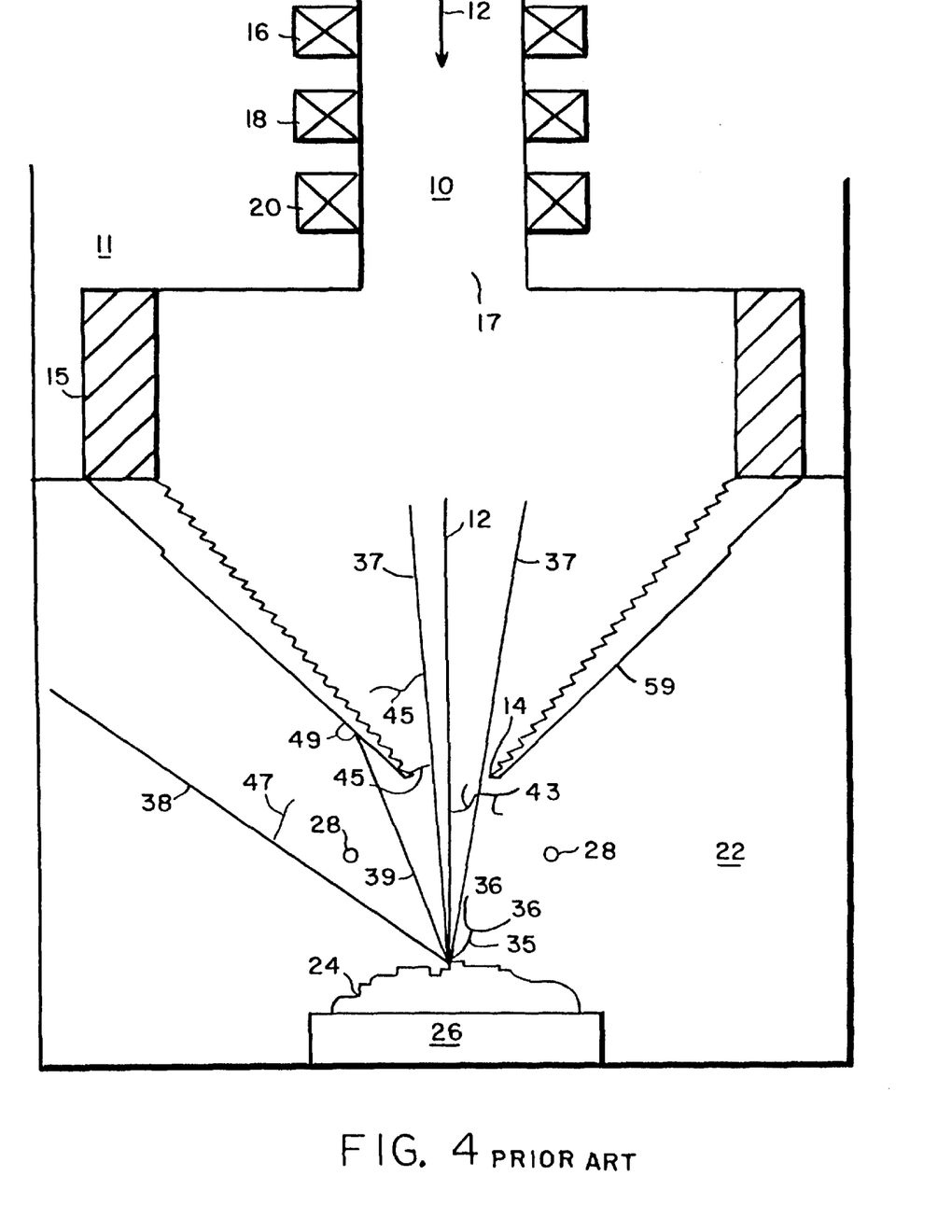
FIG. 4 is a schematic representation of one preferred embodiment of the environmental scanning electron microscope of U.S. Pat. Nos. 5,362,964 and 5,412,211 illustrating preferred electron path trajectories.

Referring now to FIGS. 3 and 4, the prior environmental scanning electron microscope of U.S. Pat. Nos. 5,362,964 and 5,412,211 is illustrated, the subject matter of which are incorporated by reference. In this environmental scanning electron microscope, a device for generating, amplifying and detecting secondary and backscattered electrons emanating from a surface of a sample being examined is provided. More specifically, a beam of electrons 12 is emitted through an electron optical column 10 and the objective lens assembly 11 by an electron gun (not shown). The electron optical column 10 includes a final pressure limiting aperture 14 at its lower end thereof. The final pressure limiting aperture 14 is formed within the lower end of an aperture carrier 15. This aperture carrier 15 is discussed in U.S. Pat. No. 4,823,006, the subject matter of which is incorporated by reference. This aperture carrier includes a second pressure limiting aperture 17 positioned above the final pressure limiting aperture 14 which communicates directly with the electron optical column 10. The electron beam passes through magnetic lenses 16 and 18 which are used to control the intensity of the electron beam. Focusing means 20 locating within the objective lens assembly 11 adjacent to the vacuum column is capable of directing the beam of electrons through the final pressure limiting aperture 14.

In the prior ESEM construction of FIG. 3, the beam is subsequently directed into a specimen chamber 22 through final pressure limiting aperture 14 wherein it impinges upon a specimen 24 supported on a specimen stage. The specimen mount or stage 26 is located within the specimen chamber 22 and is positioned for supporting specimen 24 approximately 1 to 25 mm, and preferably 1 to 10 mm, below final pressure limiting aperture 14 so as to allow the beam of electrons to interact with the specimen. The specimen chamber is disposed below the electron optical column 10 and is capable of maintaining the sample 24 enveloped in gas, preferably nitrogen or water vapor, at a pressure of approximately between $10^{-2}$ to 50 Torr in registration with the final pressure limiting aperture such that a surface of the specimen may be exposed to the charged particle beam emitted from the electron gun and directed through the pressure limiting aperture 14.

Figure 5:
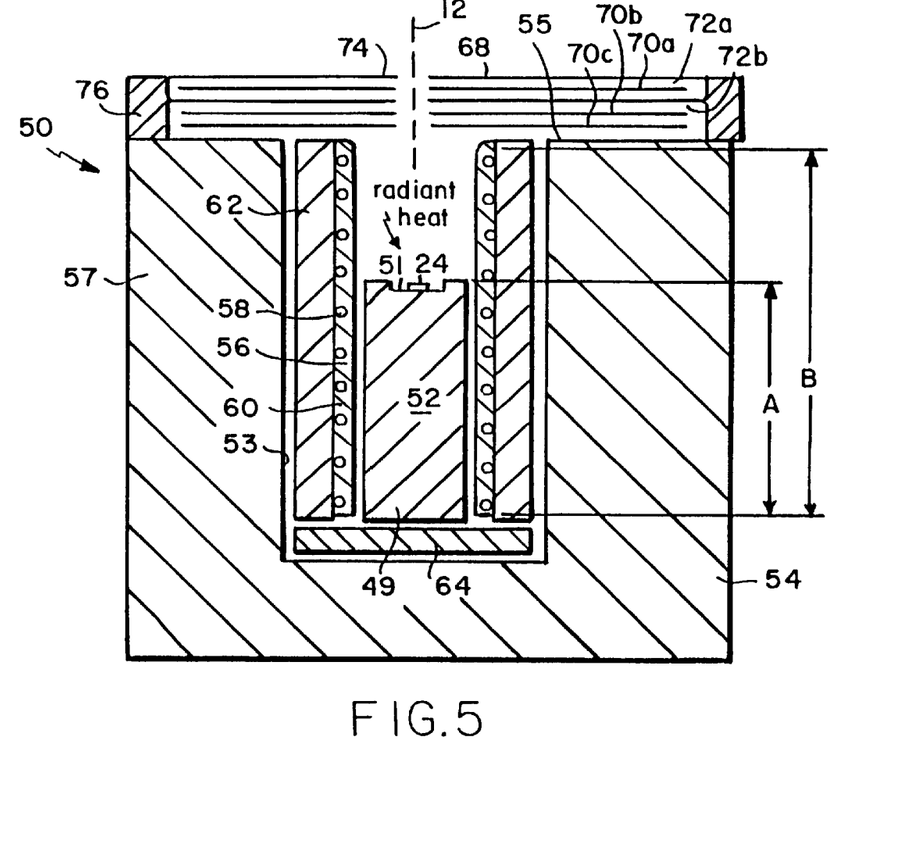
FIG. 5 is a schematic representation of a preferred embodiment of a high temperature specimen stage for an environmental scanning electron microscope in accordance with the teachings of the present invention.

A preferred embodiment of a high temperature specimen stage 50 for an environmental scanning electron microscope of the present invention which achieves a sample temperature of at least approximately 1500° C. is shown in FIG. 5. As will be explained in more detail below, this high temperature specimen stage uses the same principle as a standard furnace used to heat samples to high temperatures—the sample is surrounded by a furnace at the high temperature.

As is shown in FIG. 5, in the high temperature specimen stage 50 of the present invention, the specimen 24 is supported on a sample platform 49. The sample platform includes a loose, disposable sample cup 52 which is contained within a recess 53 of an insulating jacket 54. The specimen 24 is supported in a depression 51 formed in the top surface of the sample cup 52 at a first vertical height in the recess 53, designated by reference character A in FIG. 5. In the preferred embodiment, the sample cup 52 is made of a high thermally conductive material, preferably magnesium oxide. As shown in FIG. 5, the annular upper edge 55 of the insulating jacket 54 extends to a height substantially above the first vertical height A of the sample 24 supported in the sample cup 52.

Figure 6:
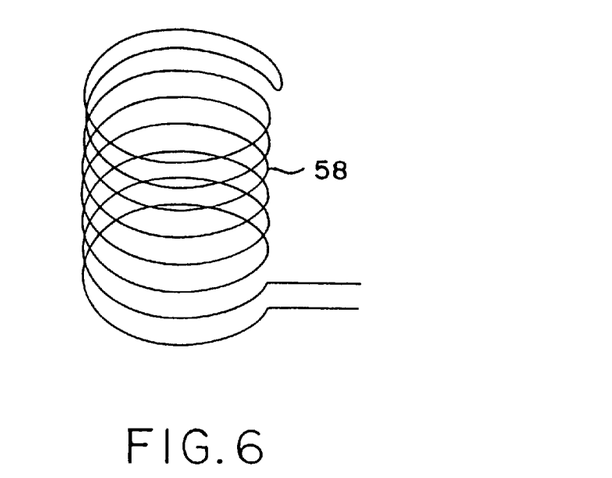
FIG. 6 is a schematic representation of a non-inductively wound heater coil incorporated in the heater assembly of the high temperature stage of FIG. 5.

In the specimen stage 50, a specimen heating assembly 56 is supported in the recess 53 of the insulating jacket 54 which heats the specimen under examination. The specimen heater assembly 56 is positioned immediately adjacent to the sample cup 52 and extends to a height which is generally contiguous with the upper edge 55 of the insulating jacket 54. As shown in FIGS. 5 and 6, the specimen heater assembly 56 includes a non-inductively wound heater coil 58 which extends the entire length of the heater assembly 56 to a second vertical height in the recess 53, designated by reference character B in FIG. 5, which extends significantly above the first vertical height A of the sample. As a result of this design, the top surface of the specimen is maintained at a high temperature.

The specimen heater assembly 56 further includes a ceramic coating 60 (see FIG. 5) covering the heater wire 58 to hold the shape of the heater wire 58. In addition, in order to further insulate the sample platform, avoid further radiant heat loss and support the heater wire 58, a ceramic tube 62 is positioned in the recess 53 of the insulating jacket 54 between the heater assembly 56 and the upstanding edge 57 of the insulating jacket 54. As is shown in FIG. 5, the sample cup 52, the heater assembly 56, and the ceramic tube 62 are supported within the recess 53 of the insulating jacket 54 by means of an insulated support stand 64 which is attached preferably by cement to the ceramic tube 62. Moreover, the ceramic coating 60 of the heater assembly 56, the ceramic tube 62, the support stand 64, and the insulating jacket 54 are preferably made of aluminum oxide to thereby better direct heat to the sample cup 52.

In order to avoid radiant heat loss upwardly from the specimen heater assembly 56, a heat shield assembly 68 is placed above the sample cup 52, heater assembly 56, ceramic tube 62 and the insulating jacket 54. As is shown in FIG. 5, the heat shield assembly 68 includes a central opening 74 such that the electron beam 12 can pass therethrough and strike the specimen 24 supported on the sample cup 52. The heat shield assembly 68 further includes a plurality of thin ceramic insulating shields, such as 70*a*, 70*b*, and 70*c*, which act as heat reflectors, and a plurality of perforated metal support plates, such as 72*a* and 72*b*, integrally formed therewith to avoid warping of the heat shield assembly at high temperatures. In the preferred embodiment, the ceramic insulating shields 70*a–c* are formed of alumina paper and the metal support plates 72*a–b* are formed of perforated stainless steel. The heat shield assembly 68 including the thin ceramic insulating shields 70*a–c* and the perforated metal support plates 72*a–b* is supported in its proper position by means of an annular support ring 76.

Therefore, the design of this hot temperature specimen stage for an ESEM achieves the following advantages over the prior ESEM specimen stage of FIGS. 1 and 2; namely:

1. Since the sample cup 52 is made of a high thermally conductive material, the temperature differential between the top and bottom of the sample cup 52 is minimized;
2. Since the heater wire 58 is wound as a coil, the entirety of the heater wire is positioned close to the sample cup 52 in comparison to the prior torroidal heater assembly of FIGS. 1 and 2;
3. Since the heater assembly 56 with the heater coil 58 extends significantly above the sample 24, the top of the sample 24 is irradiated by the heater coil 58 in order to maintain the sample at a high temperature.
4. Since the heater wire 58 is wound non-inductively, the magnetic field from the heating current is minimized which otherwise would cause deflection of the primary beam.

Accordingly, as a result of these advantageous features, the hot temperature specimen stage of the present invention can achieve a sample temperature of at least approximately 1500° C.

As aforementioned, the hot temperature specimen stage discussed above advantageously achieves an increased sample temperature and minimizes the temperature difference between the sample surface and the heater coil 56. However, it has been found that the foregoing hot temperature specimen stage creates an electrostatic shield around the specimen which causes inherent difficulties in extracting the electron signal through the central opening 74 of the heat shield assembly 68.

Figure 7:
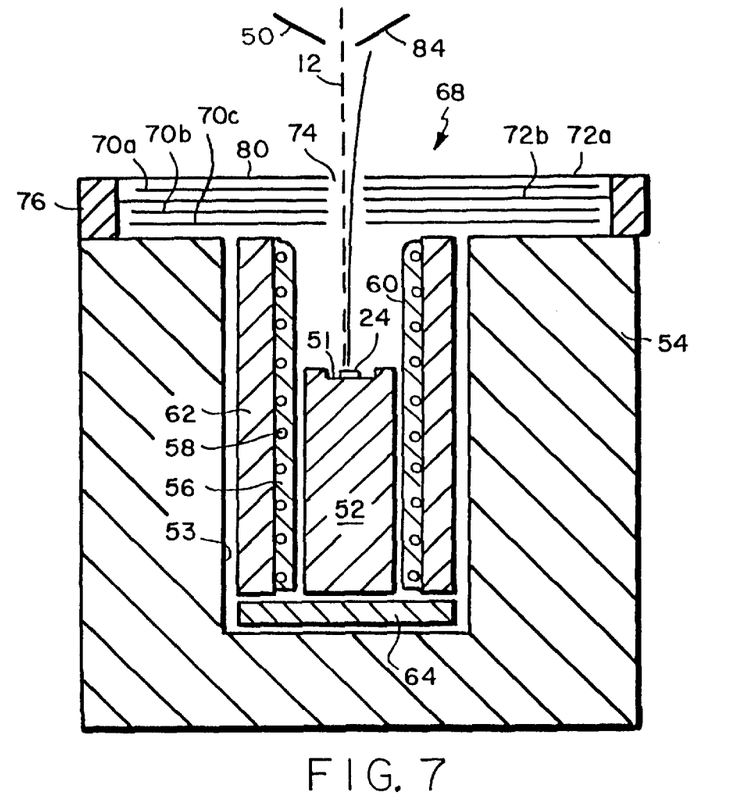
FIG. 7 is a schematic representation of the high temperature specimen stage for an environmental scanning electron microscope of FIG. 5 which specifically illustrates an adjustable bias voltage being applied to a heat shield assembly.

In order to alleviate this inherent problem, as is schematically shown in FIG. 7, an adjustable bias voltage 80 is applied to the heat shield assembly 68 to thereby accelerate the secondary electrons emanating from the surface of the specimen 24 to pass through the central opening 74 of the heat shield assembly and be subsequently collected by final pressure limiting aperture detector 50. Preferably, the shield bias may be positive or negative depending upon the temperature and the bias applied to the detector 50 represented by reference numeral 84 in FIG. 7. Voltages up to 500V may be required for suitable acceleration of the secondary electrons such that they are collected by the secondary electron detector 50.

Referring again to FIG. 3, a ring detector 28 was provided in the specimen chamber of the environmental scanning electron microscope of U.S. Pat. Nos. 5,362,964 and 5,412,211 between the final pressure limiting aperture 14 and the specimen 24. This ring electrode detector is disclosed as being preferably formed of a thin ring, made of metal, and having a wire thickness of approximately 50 to 1,000 microns. According to the '964 and '211 patents, the diameter of the ring detector 28 is slightly larger than the diameter of the final pressure limiting aperture 14 and is separated therefrom.

When the primary beam 12 strikes the specimen 24, as in FIG. 3, secondary electrons 35 and backscattered electrons, such as 37, 38 and 39, are released from the sample. For purposes of illustration in the prior ESEM of FIG. 3, the '964 and '211 patents discussed that the bias voltage was to be applied to the ring electrode 28 of approximately +500V. The bullet detector 30 which forms the final pressure limiting aperture 14 is unbiased. In this configuration, high positive voltage on the ring electrode 28 causes the secondary electrons 35 emanating from the surface of the sample to be accelerated until they strike gas molecules of the gaseous environment in the specimen chamber 22. Multiple collisions with the gaseous environment cause other electrons to be released which are, as well, accelerated towards the ring electrode 28. Some examples of signal-gas interactions which are described in U.S. Pat. No. 4,992,662 to Danilatos and specifically incorporated herein are: gaseous scintillation, ionization, chemical combination, chemical disassociation, electron attachment, photo-ionization, X-ray reactions, rotational and vibrational collisions, collisions characterized by a particular energy loss, etc. According to the '964 and '211 patents, there will generally be many such collisions and eventually a cloud of hundreds or thousands of electrons will reach the ring electrode 28. The main objective, however, of the ring electrode 28 is to collect the electrons triggered by secondary electrons emanating from the specimen 24.

However, as illustrated in FIG. 3, secondary electrons are also generated by gas collisions from other sources; namely:

(a) collisions between the primary beam 12 and the gaseous environment of the specimen chamber, these secondary electrons being represented by reference numeral 43 in FIG. 3;

(b) collisions between the backscattered electrons 37 that pass through the pressure limited aperture 14 and the gaseous environment of the specimen chamber 22, these secondary electrons being represented by reference numeral 45;

(c) collisions between the backscattered electrons 38 which pass through the gaseous environment between the sample 24 and the remainder of the specimen chamber, these secondary electrons being represented by reference number 47; and (d) backscattered electrons 39 which strike the pressure limited aperture 14, and generate secondary electrons which are referred to by reference numeral 49.

All of the secondary electrons generated by these collisions are amplified by gas multiplication and the gaseous environment of the specimen chamber and add to the desired secondary electron signal. However, the secondary electrons that derive from the backscattered electrons, such as 43, 45, 47 and 49, add an undesired backscattered component to the secondary electron image being received by the ring detector 28. Furthermore, the secondary electrons 43 created by collisions between the primary beam 12 and the gaseous environment of the specimen chamber cause an undesired background noise component.

Thus, in order to enhance its signal capabilities, the environmental scanning electron microscope disclosed in U.S. Pat. Nos. 5,362,964 and 5,412,211 incorporated an improved secondary electron detector which reduced the backscattered electron component of the signal, such as signals 43, 45, 47 and 49 present in the FIG. 3 example, and reduced the signal noise produced by the primary beam, such as signal 43. In the embodiment of the environmental scanning electron microscope of U.S. Pat. Nos. 5,362,964 and 5,412,211 shown in FIG. 4, the ring electrode 28 is biased at an electrical potential between approximately 200 and 2,000 volts, and preferably 500 volts. Additionally, a pressure limiting aperture electrode 59 is formed integrally with the bullet detector defining the final pressure limiting aperture and is biased at an electrical potential between 200 and 2,000 volts and preferably 500 volts. In the ESEM of U.S. Pat. Nos. 5,362,964 and 5,412,211, the ring electrode 28 and the pressure limiting aperture electrode 50 are preferably biased at the same electrical potential.

As an example of the effect of the ESEM design of FIG. 4, if the ring electrode 28 and the final pressure limiting aperture electrode 50 are both biased at 500 volts, the desired secondary electrons 35 are accelerated and multiplied in the gaseous environment of the specimen chamber 22 to generate further secondary electrons 36 which are still collected by the ring electrode 28. However, in this configuration, most of the undesired secondary electrons are intercepted by the final pressure limiting aperture electrode 59. More specifically, the secondary electrons 45 generated by collisions with the backscattered electrons 37 are attracted to the positive surface of the pressure limiting aperture electrode 59. Further, many of the secondary electrons 43 generated by collisions between the primary beam 12 and the gaseous environment of the specimen chamber 22 are also attracted to the pressure limiting aperture electrode 59. In addition, the secondary electrons 49 generated by collisions between a backscattered electron 39 and the pressure limiting aperture 50 will no longer be accelerated away from the pressure limiting aperture and no gas amplification occurs. Accordingly, most of the undesirable signal components are not collected by the ring electrode 28, and therefore, the image signal derived from the ring electrode 28 is a more pure secondary electron image having a lower noise level.

Figure 8:
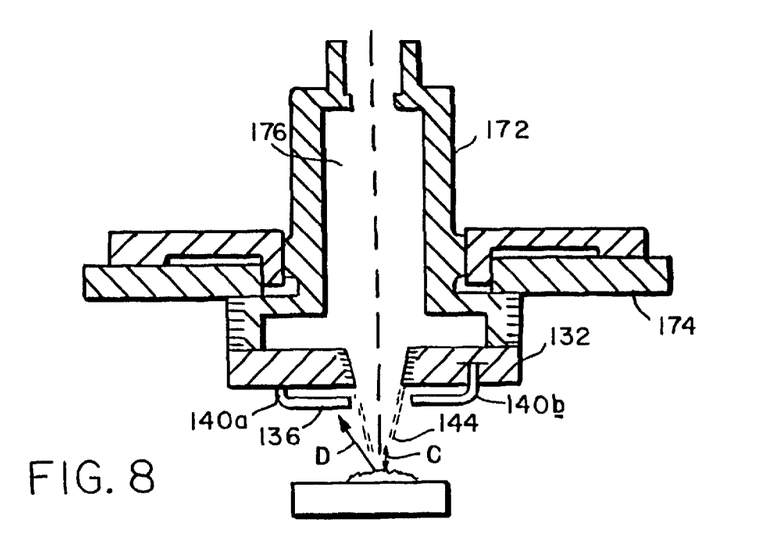
FIG. 8 is a schematic representation of an improved gaseous electron detector assembly wherein components thereof can be used in conjunction with the high temperature specimen stage for an environmental scanning electron microscope of the present invention illustrated in FIG. 5.

A further object of this invention is to employ an improved gaseous electron detector in the ESEM utilizing the hot temperature specimen stage of the present invention similar to the gaseous electron detector shown in FIG. 20 of U.S. Pat. No. 5,412,211. As is shown in FIG. 8, an environmental scanning electron microscope employing printing circuit board technology is shown. In this ESEM, a printed circuit board 132 is positioned in the specimen chamber in a generally horizontal manner. The detector body 172 is mounted to the electron optical column and provides a path of the electron beam to pass therethrough. This detector body 172 is described in U.S. Pat. No. 5,412,211 as being similar to the aperture carrier described in U.S. Pat. No. 4,823,006 assigned to the common assignee of this application except that the detector head in FIG. 8 forms the lower portion of the detector body. As is shown in FIG. 8, this detector body 172 is threaded into the electron optical column 174. In this configuration, a signal collection ring electrode 136 extends downwardly from the printed circuit board 132 by means of support legs, such as 140a and 140b, and faces the specimen 24 under examination. As a result thereof, U.S. Pat. No. 5,412,211 describes that the primary beam passes through the final pressure limited aperture 144 and impinges upon the specimen 24. Secondary electrons emitted from the surface of the specimen are thus collected by the suitably biased signal ring electrode 136.

Figure 9:
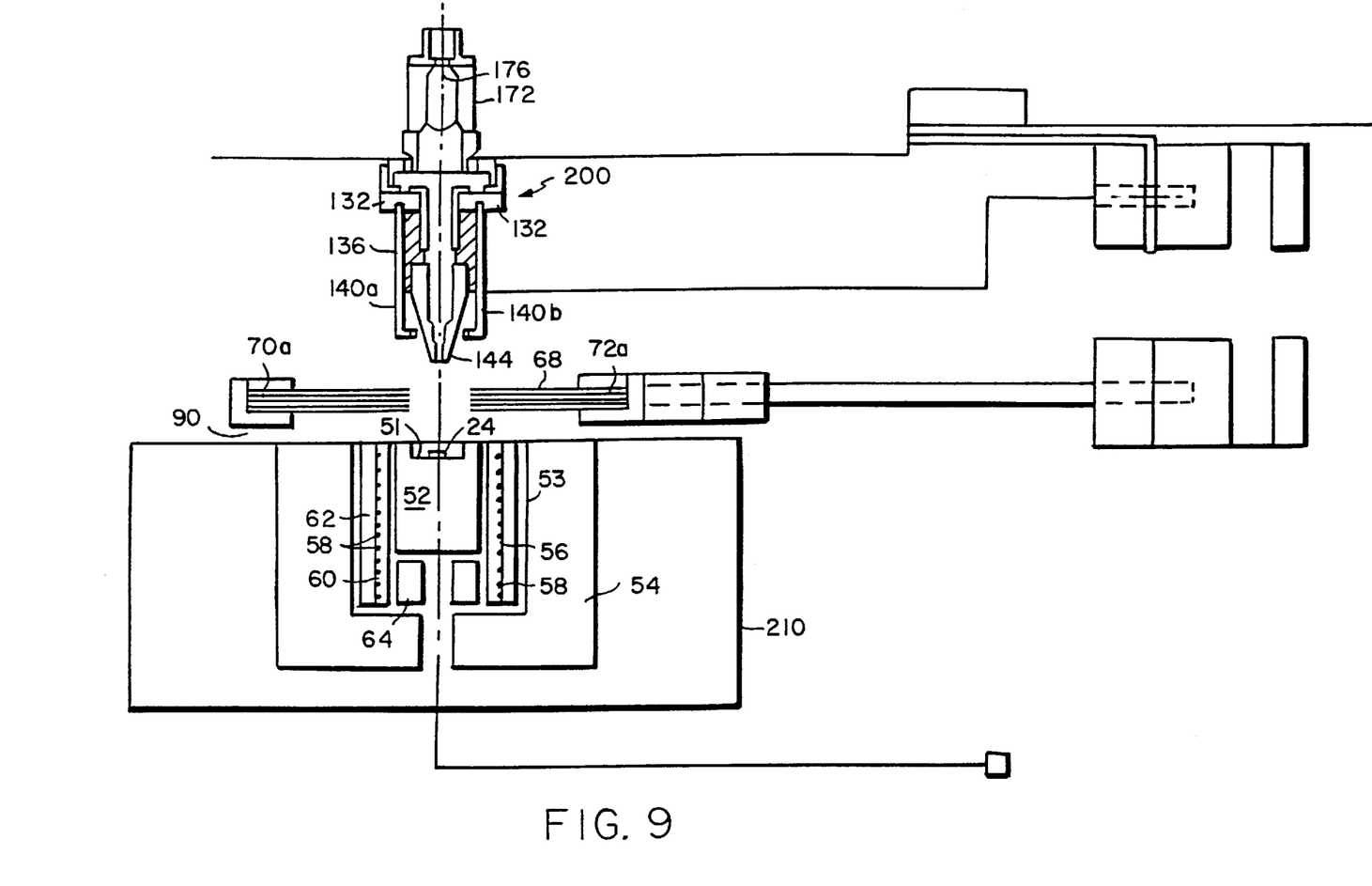
FIG. 9 is a schematic representation of the environmental scanning electron microscope incorporating the high temperature specimen stage of FIG. 5 and specifically illustrates a specimen stage moving assembly for moving the specimen stage independently of the heat shield assembly to observe different parts of the specimen under examination and enhance the field-of-view of the specimen.

In order to minimize beam loss during the path of the electron beams through the gas between the detector and the sample, the electron beam path can be shortened by positioning the sample very close to the detector. In accordance therewith, an improved gaseous electron detector has been designed which creates a short electron beam path to the sample through the gaseous environment of the specimen chamber, but maintains a relatively long gas path to the detector. In the improved electron detector of FIG. 8, the final pressure limiting aperture 144 of the printed circuit board 132 angularly extends inwardly in an inverted conical arrangement through the collection ring electrode 136 of the printed circuit board 132. This reduces the length of the path of the electron beam through the chamber gas represented by the distance C in FIG. 8. However, the path from the sample 24 to the signal ring electrode 136 represented by the distance D is still sufficiently long enough to obtain satisfactory detection performance. The incorporation of this improved electron detector in the environmental scanning electron microscope incorporating the hot temperature specimen stage of the present invention is best illustrated in FIG. 9.

Figure 10:
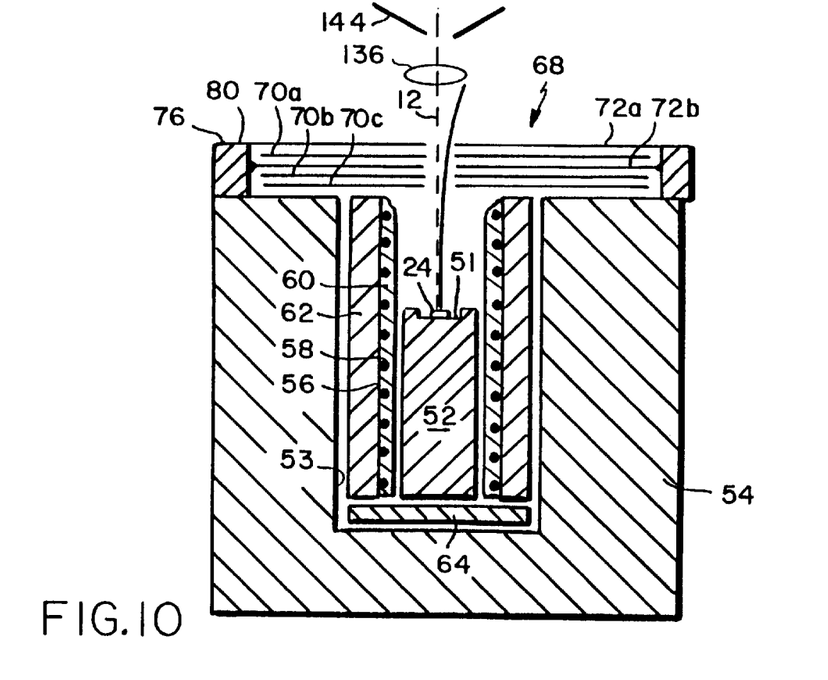
FIG. 10 is a schematic representation of the high temperature specimen stage for an environmental scanning electron microscope of FIG. 5 and specifically illustrates biasing the final pressure limiting aperture at a different voltage from the secondary electron detector electrode.

Referring now to FIG. 10, the image quality may be improved by incorporating the aforementioned features described in U.S. Pat. Nos. 5,362,964 and 5,412,211, the disclosure of which is incorporated by reference. It has been found that the image quality can be further enhanced by biasing the final pressure limiting aperture 144 at a different voltage from the signal collection ring electrode 136. In practice, the final pressure limiting aperture 144 is isolated which allows the final pressure limiting aperture 144 to "float" to a stable voltage. "Floating" the bias voltage of the final pressure limiting aperture is desirable as it has been found to provide for automatic compensation. As a result thereof, superior image quality is obtained. The same performance and image quality can be achieved with a variable bias voltage, but in order to utilize a variable bias voltage, it has been found that another power supply and control of its voltage in the required way has to be provided.

Figure 11:
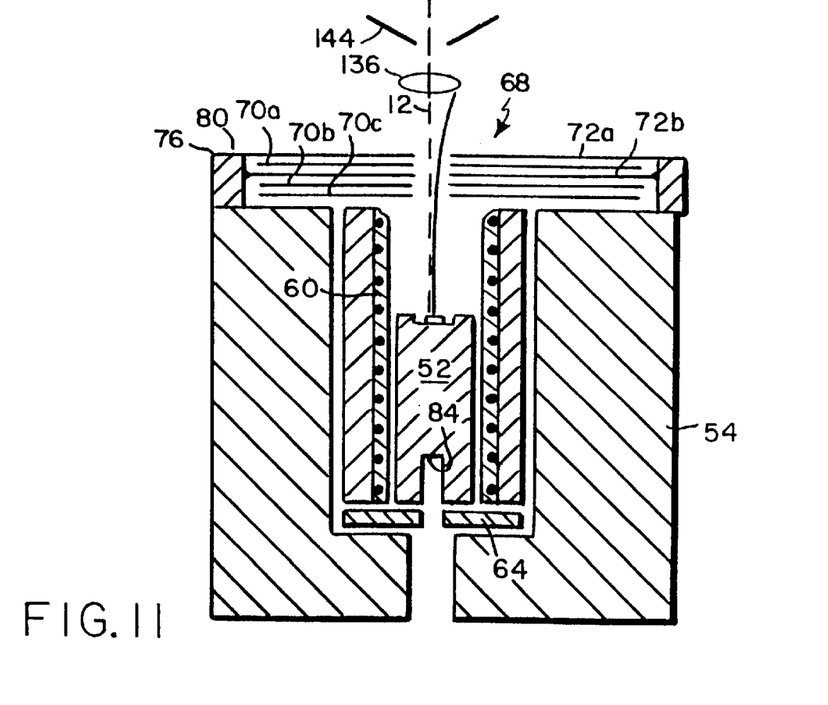
FIG. 11 is a schematic representation of the high temperature specimen stage for an environmental scanning electron microscope of FIG. 5 which is similar to FIG. 10 and specifically illustrates applying a bias voltage to the sample cup supporting the specimen.

A further improvement of the hot temperature specimen stage for an environmental scanning electron microscope of the present invention is schematically shown in FIG. 11 wherein the bias voltage is applied to the thermally conductive sample cup 52. More specifically, at very high temperatures (above about 800° C.), the surfaces of the sample start to emit a significant amount of thermal electrons. The shield biasing scheme described above (i.e., the heat shield assembly 68) extracts these thermal electrons as well as the required secondary electrons. However, at temperatures above about 1000° C., these thermal electrons override the required secondary electrons. These thermal electrons can be suppressed by applying a bias voltage to the sample cup. This bias voltage applied to the sample cup 52 is represented by reference numeral 84 in FIG. 11. This biasing of the sample cup 52 also requires that the sample cup be electrically conductive. Bias voltages between +50 and −50V have been found to be required to suitably suppress undesired thermal electrons.

Figure 12A:
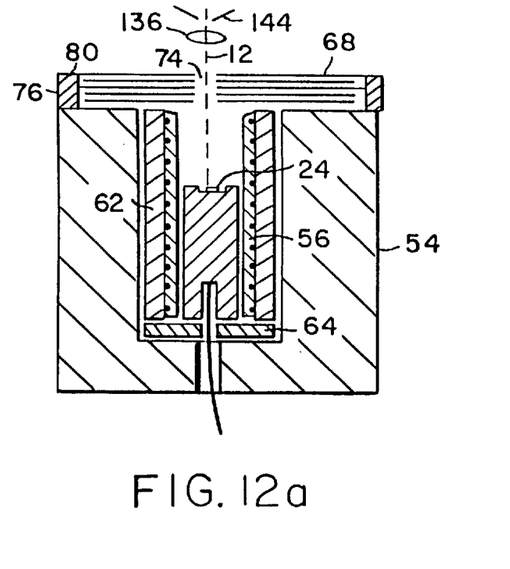
FIGS. 12a and 12b are schematic representations of the high temperature specimen stage for an environmental scanning electron microscope of FIG. 5 which specifically illustrates integrally mounting the heat shield assembly with respect to the specimen stage thereby inherently limiting the size of the specimen which can be observed.
Figure 12B:
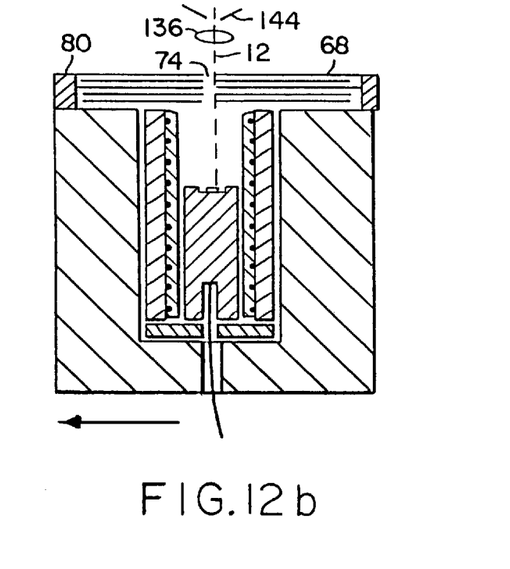

In the design of the high temperature specimen stage for an environmental scanning electron microscope of FIG. 5, the heat shield assembly 68 is formed integrally with the specimen stage. As is shown in FIGS. 12a and 12b, the integrally formed stage/heat shield assembly/sample cup is moved laterally in unison in order to observe different parts of the sample. Hence, the observable area of the sample is limited by the size of the central opening 74 of the heat shield assembly 68. However, the central opening 74 of the heat shield assembly must be necessarily small (e.g., 2 mm diameter) to prevent heat loss, and consequently, this relatively small opening limits the size of the sample that can be observed.

Figure 13A:
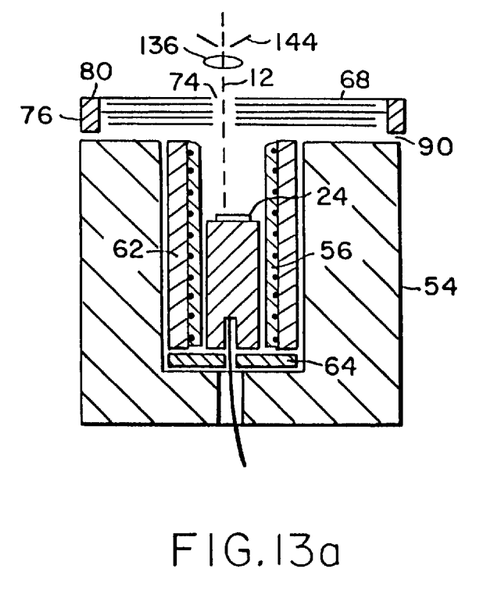
FIGS. 13a and 13b are schematic representations of the high temperature specimen stage for an environmental scanning electron microscope of FIG. 5 specifically illustrating the heat shield assembly being aligned with respect to the secondary electron detector and the final pressure limiting so that the specimen stage can be laterally moved independently of the heat shield assembly by a specimen stage moving assembly to observe a larger area of the specimen under examination, and hence, enhance the field-of-view of the specimen.
Figure 13B:
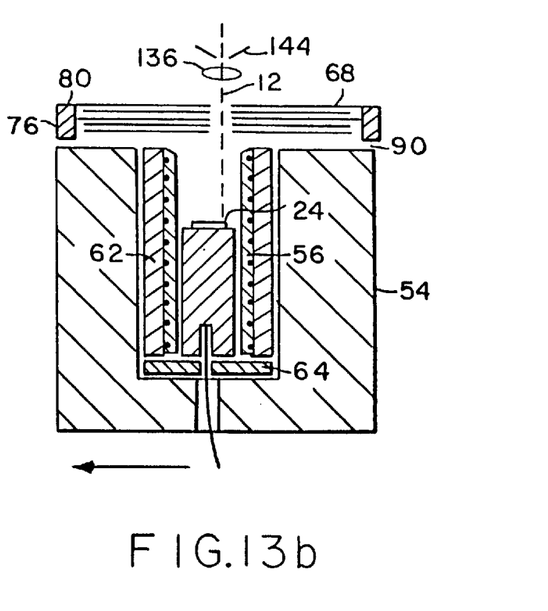

In order to overcome this problem, another preferred embodiment of the high temperature specimen stage for an environmental scanning electron microscope of the present invention is shown in FIGS. 13a and 13b. As is shown in FIGS. 13a and 13b, the heat shield assembly 68 is fixed in relation to the final pressure limiting aperture 144 and the signal ring electrode 136. A small gap 90 is provided between the heat shield assembly 68 and the specimen stage assembly. Thus, the specimen stage, and hence the sample 24, can be moved independently of the heat shield assembly 68. This allows a larger area of the specimen 24 to be observed, and accordingly, increases the field-of-view of the specimen. This separation of the heat shield assembly 68 from the specimen stage is further shown in FIG. 9. As is shown in FIG. 9, the specimen stage moving mechanism 210 laterally moves the specimen stage 50 independently of the heat shield assembly 68 which stays aligned with the electron detector 136 and the final pressure limiting aperture 144.

Accordingly, in accordance with the general objects of the present invention, a high temperature specimen stage for an environmental scanning electron microscope has been designed which achieves sample temperatures of up to approximately 1500° C. In addition, the high temperature specimen stage for an ESEM of the present invention minimizes the temperature differential between the sample and the heater wire to maintain the top of the specimen as being at a high temperature. Moreover, the high temperature specimen stage of the present invention minimizes the magnetic field from the heating current which otherwise would cause deflection of the primary beam.

As aforementioned, in this high temperature specimen stage, the bias voltage applied to the sample cup is combined with the bias voltage applied to the heat shield assembly to suppress thermal electrons while still collecting secondary electrons. In addition, a differential voltage can be applied between the secondary electron detection ring and the pressure limiting aperture to enhance imaging quality. Further, "floating" the bias of the final pressure limiting aperture can achieve automatic compensation. Moreover, in the high temperature specimen stage of the present invention, the heat shield assembly can be mounted separately from the specimen stage so that the specimen stage can be moved independently of the heat shield assembly to enhance the field-of-view of the specimen.

Although the invention has been particularly shown and described with reference to certain preferred embodiments, it will be readily appreciated by those of ordinary skill in the art that various changes and modifications may be made therein without departing from the spirit and scope of the invention. It is intended that the appended claims be interpreted as including the foregoing as well as various other such changes and modifications.

What is claimed is:

1. A specimen stage for a specimen chamber of an environmental scanning electron microscope, wherein the specimen chamber maintains a specimen under examination enveloped in gas, said specimen stage comprising:
   sample platform means for supporting a specimen under examination at a first vertical height; and
   specimen heating means for heating said specimen, said specimen heating means including a heater coil which is positioned closely adjacent to said sample platform means and extends to a second vertical height which is significantly above said first vertical height such that said specimen can achieve a specimen temperature of at least approximately 1500° C.

2. The specimen stage of claim 1 wherein said heater coil is a non-inductively wound heater coil.

3. The specimen stage of claim 1 wherein said specimen heating means further includes a ceramic coating covering said heater coil.

4. The specimen stage of claim 1 wherein said sample platform means comprises a loose, disposable sample cup which is contained within a recess of an insulating jacket.

5. The specimen stage of claim 4 further comprising a depression formed in said sample cup to support the specimen.

6. The specimen stage of claim 4 further comprising a ceramic tube positioned in said recess between said heating means and said insulating jacket to reflect heat generated by said heater coil.

7. The specimen stage of claim 6 wherein said sample cup, said heating means and said ceramic tube are supported within said recess of said insulating jacket on an insulated support stand to thereby further reflect heat generated by said heater coil.

8. The specimen stage of claim 7 wherein said ceramic tube and said insulating jacket are formed of aluminum oxide.

9. The specimen stage of claim 4 wherein said sample cup is formed of a high thermally conductive material.

10. The specimen stage of claim 4 wherein said sample cup is formed of magnesium oxide.

11. The specimen stage of claim 1 further including a heat shield assembly positioned above said heating means to avoid radiant heat loss.

12. The specimen stage of claim 11 wherein said heat shield assembly includes a plurality of thin ceramic insulating shields which act as heat reflectors and a plurality of perforated metal support plates integrally formed therewith to avoid warping of said heat shield assembly at high temperatures.

13. The specimen stage of claim 12 wherein said ceramic insulating shields are formed of alumina paper and said metal support plates are formed of perforated stainless steel.

14. The specimen stage of claim 11 wherein said heat shield assembly is supported in the position above said heating means by means of an annular support ring.

15. An environmental scanning electron microscope comprising:
   (a) means for generating and directing an electron beam through a final pressure limiting aperture toward a specimen under examination;
   (b) a specimen chamber which maintains the specimen enveloped in gas in registration with said final pressure limiting aperture, said specimen chamber including a specimen stage comprising sample platform means for supporting the specimen under examination at a first vertical height, and specimen heating means for heating said specimen, said specimen heating means including a heater coil which is positioned closely adjacent to said sample platform means and extends to a second vertical height which is significantly above said first vertical height such that said specimen can achieve a specimen temperature of up to at least approximately 1500° C.; and
   (c) means for detecting signals emanating from the surface of the specimen.

16. The environmental scanning electron microscope of claim 15 wherein said heater coil is a non-inductively wound heater coil.

17. The environmental scanning electron microscope of claim 15 wherein said specimen heating means further includes a ceramic coating covering said heater coil.

18. The environmental scanning electron microscope of claim 15 wherein said sample platform means comprises a loose, disposable sample cup which is contained within a recess of an insulating jacket.

19. The environmental scanning electron microscope of claim 18 further comprising a depression formed in said sample cup to support the specimen.

20. The environmental scanning electron microscope of claim 18 further comprising a ceramic tube positioned in said recess between said heating means and said insulating jacket to reflect heat generated by said heater coil.

21. The environmental scanning electron microscope of claim 20 wherein said sample cup, said heating means and said ceramic tube are supported within said recess of said insulating jacket on an insulated support stand to thereby further reflect heat generated by said heater coil.

22. The environmental scanning electron microscope of claim 21 wherein said ceramic tube and said insulating jacket are formed of aluminum oxide.

23. The environmental scanning electron microscope of claim 18 wherein said sample cup is formed of a high thermally conductive material.

24. The environmental scanning electron microscope of claim 18 wherein said sample cup is formed of magnesium oxide.

25. The environmental scanning electron microscope of claim 15 further including a heat shield assembly positioned above said heating means in said specimen chamber to avoid radiant heat loss.

26. The environmental scanning electron microscope of claim 25 wherein said heat shield assembly includes a plurality of thin ceramic insulating shields which act as heat reflectors and a plurality of perforated metal support plates integrally formed therewith to avoid warping of said heat shield assembly at high temperatures.

27. The environmental scanning electron microscope of claim 26 wherein said ceramic insulating shields are formed of alumina paper and said metal support plates are formed of perforated stainless steel.

28. The environmental scanning electron microscope of claim 25 wherein said heat shield assembly is supported in the position above said heating means by means of an annular support ring.

29. The environmental scanning electron microscope of claim 25 wherein said heat shield assembly includes a central opening to permit the electron beam to pass therethrough to strike the specimen.

30. The environmental scanning electron microscope of claim 29 further comprising means for providing an adjustable bias voltage applied to said heat shield assembly to accelerate secondary electrons from the specimen through said central opening to be collected by said detector means.

31. The environmental scanning electron microscope of claim 30 wherein an adjustable bias voltage of up to approximately 500V is applied to said heat shield assembly.

32. The environmental scanning electron microscope of claim 30 wherein:
said means for detecting signals emanating from the surface of the specimen is formed of a thin ring electrode; and
said final pressure limiting aperture is biased at a different voltage than that of said thin ring electrode to enhance image quality.

33. The environmental scanning electron microscope of claim 32 wherein the bias voltage applied to said final pressure limiting aperture floats to provide for automatic compensation.

34. The environmental scanning electron microscope of claim 33 further comprising means for providing a bias voltage of between approximately +50 and −50V applied to said sample platform means to suppress thermal electrons.

35. The environmental scanning electron microscope of claim 29 wherein said heat shield assembly is aligned with respect to said final pressure limiting aperture and said detector means is separated from said specimen stage.

36. The environmental scanning electron microscope of claim 35 further including means for laterally moving said specimen stage with respect to said heat shield assembly to enhance the field-of-view of the specimen.

37. An environmental scanning electron microscope comprising:
(a) means for generating and directing an electron beam through a final pressure limiting aperture toward a specimen under examination;
(b) a specimen chamber which maintains the specimen enveloped in gas in registration with said final limiting aperture, said specimen chamber including a specimen stage comprising sample platform means for supporting the specimen under examination and specimen heating means for heating said specimen, and a heat shield assembly positioned above said heating means in said specimen chamber to avoid radiant heat loss, said heat shield assembly including a central opening to permit the electron beam to pass therethrough to strike the specimen;
(c) means for detecting signals emanating from the surface of the specimen;
(d) means for providing an adjustable bias voltage of up to approximately 500V applied to said heat shield assembly to accelerate secondary electrons emanating from the specimen to pass through said central opening to be collected by said detector means; and
(e) means for providing a bias voltage of between about +50 and −50V applied to said sample platform means to suppress thermal electrons.

38. An environmental scanning electron microscope comprising:
(a) means for generating and directing an electron beam through a final pressure limiting aperture toward a specimen under examination;
(b) a specimen chamber which maintains the specimen enveloped in gas in registration with said final pressure limiting aperture, said specimen chamber including a specimen stage comprising sample platform means for supporting the specimen under examination and specimen heating means for heating said specimen; and
(c) means for detecting signals emanating from the surface of the specimen, which is formed of a thin ring electrode; and
wherein said final pressure limiting aperture is biased at a different voltage than that of said thin ring electrode to enhance image quality.

39. The environmental scanning electron microscope of claim 38 wherein the bias voltage applied to said final pressure limiting aperture floats to provides for automatic compensation.

40. An environmental scanning electron microscope comprising:
(a) means for generating and directing an electron beam through a final pressure limiting aperture toward a specimen under examination;
(b) a specimen chamber which maintains the specimen enveloped in gas in registration with said final pressure limiting aperture, said specimen chamber including a specimen stage comprising sample platform means for supporting the specimen under examination and specimen heating means for heating said specimen, and a heat shield assembly positioned above said heating means in said specimen chamber to avoid radiant heat loss, said heat shield assembly including a central opening to permit the electron beam to pass therethrough;

(c) means for detecting signals emanating from the surface of the specimen; and (d) means for laterally moving said specimen stage with respect to said heat shield assembly to enhance the field-of-view of the specimen, wherein said heat shield assembly is aligned with respect to said final pressure limiting aperture and said detector means is separated from said specimen stage so that said specimen stage moves independently of said heat shield assembly.

41. The environmental scanning electron microscope of claim 40 wherein said heat shield assembly includes a plurality of thin ceramic insulating shields which act as heat reflectors and a plurality of perforated metal support plates integrally formed therewith to avoid warping of said heat shield assembly at high temperatures.

42. The environmental scanning electron microscope of claim 41 wherein said ceramic insulating shields are formed of alumina paper and said metal support plates are formed of perforated stainless steel.

43. The environmental scanning electron microscope of claim 42 further comprising means for providing an adjustable bias voltage of up to approximately 500V applied to said heat shield assembly to accelerate secondary electrons emanating from the specimen to pass through said central opening to be collected by said detector means.

44. An environmental scanning electron microscope comprising:

(a) means for generating and directing an electron beam through a final pressure limiting aperture toward a specimen under examination;

(b) a specimen chamber which maintains the specimen enveloped in gas in registration with said final pressure limiting aperture, said specimen chamber including a specimen stage comprising sample platform means for supporting the specimen under examination at a first vertical height, wherein said specimen sample platform means comprises a loose, disposable sample cup which is contained within a recess of an insulating jacket, said specimen stage further including specimen heating means for heating said specimen and a ceramic tube positioned between said heating means and said insulating jacket to reflect heat generated by said heating means, said specimen heating means including a heater coil which is positioned closely adjacent to said sample platform means and extends to a second vertical height which is significantly above said first vertical height, said specimen stage further including a heat shield assembly positioned above said heating means to avoid radiant heat loss, wherein said heat shield assembly includes a central opening to permit the electron beam to pass therethrough and strike the specimen; and (c) means for detecting signals emanating from the surface of the specimen.

45. The environmental scanning electron microscope of claim 44 wherein said heater coil is a non-inductively wound heater coil.

46. The environmental scanning electron microscope of claim 44 wherein said specimen heating means further includes a ceramic coating covering said heater coil.

47. The environmental scanning electron microscope of claim 44 wherein said sample cup, said heating means and said ceramic tube are supported within said recess of said insulating jacket on an insulated support stand to thereby further reflect heat generated by said heater coil.

48. The environmental scanning electron microscope of claim 44 wherein said ceramic tube and said insulating jacket are formed of aluminum oxide.

49. The environmental scanning electron microscope of claim 44 wherein said heat shield assembly includes a plurality of thin ceramic insulating shields which act as heat reflectors and a plurality of metal support plates integrally formed therewith to avoid warping of said heat shield assembly at high temperatures.

50. The environmental scanning electron microscope of claim 49 wherein said ceramic insulating shields are formed of alumina paper and said metal support plates are formed of perforated stainless steel.

51. The environmental scanning electron microscope of claim 44 wherein said sample cup is formed of a high thermally conductive material.

52. The environmental scanning electron microscope of claim 44 wherein said sample cup is formed of magnesium oxide.

53. The environmental scanning electron microscope of claim 44 wherein said means for detecting signals emanating from the surface of the specimen is formed of a thin ring electrode; and said final pressure limiting aperture is biased at a different voltage than that of said thin ring electrode to enhance image quality.

54. The environmental scanning electron microscope of claim 53 wherein the bias voltage applied to said final pressure limiting aperture floats to provide for automatic compensation.

55. The environmental scanning electron microscope of claim 44 further comprising means for providing a bias voltage of between approximately +50 and −50V applied to said sample platform means to suppress thermal electrons.

56. The environmental scanning electron microscope of claim 44 wherein said heat shield assembly is aligned with respect to said final pressure limiting aperture and said detector means is separated from said specimen stage.

57. The environmental scanning electron microscope of claim 56 further including means for laterally moving said specimen stage with respect to said heat shield assembly to enhance the field-of-view of the specimen.

58. The environmental scanning electron microscope of claim 44 wherein said specimen stage is configured to achieve specimen temperatures of at least 1500° C.

59. A specimen stage for a specimen chamber of an environmental scanning electron microscope, wherein the specimen chamber maintains a specimen under examination enveloped in gas, said specimen stage comprising:

sample platform means for supporting a specimen under examination at a first vertical height; and specimen heating means for heating said specimen, said specimen heating means including a heater coil which is positioned closely adjacent to said sample platform means and extends to a second vertical height which is significantly above said first vertical height such that said specimen can achieve a substantially uniform temperature.

60. The specimen stage of claim 59 further including a heat shield assembly positioned above said heating means to avoid radiant heat loss.

61. The specimen stage of claim 60 wherein said heat shield assembly includes a plurality of thin ceramic insulating shields which act as heat reflectors and a plurality of perforated metal support plates integrally formed therewith to avoid warping of said heat shield assembly at high temperatures.

62. The specimen stage of claim 59 wherein said sample platform means comprises a sample cup formed of a high thermally conductive material contained within a recess of an insulating jacket.

63. A specimen stage for a specimen chamber of an environmental scanning electron microscope, wherein the specimen chamber maintains a specimen under examination enveloped in gas, said specimen stage comprising:

sample platform means for supporting a specimen under examination at a first vertical height; and specimen heating means for heating said specimen, said specimen heating means including a heater coil which is positioned closely adjacent to said sample platform means and extends to a second vertical height which is significantly above said first vertical height such that said specimen can achieve a temperature proximate to a melting point of said heater coil.

64. The specimen stage of claim 63 wherein said specimen heating means further includes a ceramic coating covering said heater coil.

65. The specimen stage of claim 63 wherein said sample platform means comprises a sample cup which is contained within a recess of an insulating jacket, said specimen stage further comprising a ceramic tube positioned between said heating means and said insulating jacket to reflect heat generated by said heater coil.

66. The specimen stage of claim 65 wherein said sample cup, said heating means and said ceramic tube are supported within said recess of said insulating jacket on an insulated support stand to thereby further reflect heat generated by said heater coil.

67. The specimen stage of claim 63 and further including a heat shield assembly positioned above said heating means to avoid radiant heat loss.

68. The specimen stage of claim 67 wherein said heat shield assembly includes a plurality of thin ceramic insulating shields which act as heat reflectors and a plurality of perforated metal support plates integrally formed therewith to avoid warping of said heat shield assembly at high temperatures.

69. The specimen stage of claim 68 wherein said ceramic insulating shields are formed of alumina paper and said metal support plates are formed of perforated stainless steel.

70. The specimen stage of claim 63 wherein said sample platform means comprises a sample cup formed of a high thermally conductive material contained within a recess of an insulating jacket.

71. An environmental scanning electron microscope comprising:

(a) means for generating and directing an electron beam through a final pressure limiting aperture toward a specimen under examination;

(b) a specimen chamber which maintains the specimen enveloped in gas in registration with said final pressure limiting aperture, said specimen chamber including a specimen stage comprising sample platform means for supporting the specimen under examination at a first vertical height, and specimen heating means for heating said specimen, said specimen heating means including a heater coil which is positioned closely adjacent to said sample platform means and extends to a second vertical height which is significantly above said first vertical height such that said specimen can achieve a substantially uniform temperature; and (c) means for detecting signals emanating from the surface of the specimen.

72. The environmental scanning electron microscope of claim 71 further including a heat shield assembly positioned above said heating means in said specimen chamber to avoid radiant heat loss.

73. The environmental scanning electron microscope of claim 72 wherein said heat shield assembly includes a plurality of thin ceramic insulating shields which act as heat reflectors and a plurality of perforated metal support plates integrally formed therewith to avoid warping of said heat shield assembly at high temperatures.

74. The environmental scanning electron microscope of claim 73 wherein said ceramic insulating shields are formed of alumina paper and said metal support plates are formed of perforated stainless steel.

75. The environmental scanning electron microscope of claim 72 wherein said heat shield assembly includes a central opening to permit the electron beam to pass therethrough to strike the specimen.

76. The environmental scanning electron microscope of claim 75 further comprising means for providing an adjustable bias voltage applied to said heat shield assembly to accelerate secondary electrons from the specimen through said central opening to be collected by said detector means.

77. The environmental scanning electron microscope of claim 76 wherein an adjustable bias voltage of up to approximately 500V is applied to said heat shield assembly.

78. The environmental scanning electron microscope of claim 76 wherein:

said means for detecting signals emanating from the surface of the specimen is formed of a thin ring electrode; and said final pressure limiting aperture is biased at a different voltage than that of said thin ring electrode to enhance image quality.

79. The environmental scanning electron microscope of claim 78 wherein the bias voltage applied to said final pressure limiting aperture floats to provide for automatic compensation.

80. The environmental scanning electron microscope of claim 79 further comprising means for providing a bias voltage of between approximately +50 and −50V applied to said sample platform means to suppress thermal electrons.

81. The environmental scanning electron microscope of claim 75 wherein said heat shield assembly is aligned with respect to said final pressure limiting aperture and said detector means is separated from said specimen stage.

82. The environmental scanning electron microscope of claim 81 further including means for laterally moving said specimen stage with respect to said heat shield assembly to enhance the field-of-view of the specimen.

* * * * *

UNITED STATES PATENT AND TRADEMARK OFFICE
CERTIFICATE OF CORRECTION

PATENT NO. : 6,025,592

DATED : February 15, 2000

INVENTOR(s) : W. Ralph Knowles et al.

It is certified that error appears in the above-identified patent and that said Letters Patent is hereby corrected as shown below:

In claim 15, column 12, line 58, delete "up to".

Signed and Sealed this

Twenty-sixth Day of December, 2000

Attest:

Q. TODD DICKINSON

*Attesting Officer*     *Director of Patents and Trademarks*